(12) United States Patent
Chien et al.

(10) Patent No.: US 10,990,790 B2
(45) Date of Patent: Apr. 27, 2021

(54) DISPLAY DEVICE

(71) Applicant: Innolux Corporation, Miao-Li County (TW)

(72) Inventors: Kun-Feng Chien, Miao-Li County (TW); Jian-Min Leu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 186 days.

(21) Appl. No.: 16/106,148

(22) Filed: Aug. 21, 2018

(65) Prior Publication Data

US 2019/0073509 A1 Mar. 7, 2019

(30) Foreign Application Priority Data

Sep. 6, 2017 (CN) .......................... 201710794403.1

(51) Int. Cl.
*G06K 9/00* (2006.01)
*G02F 1/1335* (2006.01)
(Continued)

(52) U.S. Cl.
CPC ....... *G06K 9/0004* (2013.01); *G02F 1/13338* (2013.01); *G02F 1/13439* (2013.01); *G02F 1/133345* (2013.01); *G02F 1/133553* (2013.01); *G06F 3/042* (2013.01); *G06F 3/0412* (2013.01); *H01L 27/14623* (2013.01);
(Continued)

(58) Field of Classification Search
None
See application file for complete search history.

(56) References Cited

U.S. PATENT DOCUMENTS 7,329,848 B2   2/2008   Shin
8,179,483 B2   5/2012   Katoh
(Continued)

FOREIGN PATENT DOCUMENTS

CN   1689025 A   10/2005
CN   1786780 A   6/2006
(Continued)

OTHER PUBLICATIONS

CN Office Action dated May 21, 2020 in Chinese application (No. 201710794403.1).

*Primary Examiner* — Phu Vu
(74) *Attorney, Agent, or Firm* — McClure, Qualey & Rodack, LLP (57) ABSTRACT

A display device including a first substrate, a sensing element, a display switch element and a blocking structure is provided. The first substrate has a first top surface perpendicular to a first direction. The sensing element is disposed on the first substrate and includes an active layer having a channel region. A first distance is formed between a channel top surface of the channel region and the first top surface of the first substrate along the first direction. The display switch element is disposed on the first substrate and adjacent to the sensing element. The blocking structure is disposed on the sensing element. The blocking structure has a bottom surface and a first opening, the first opening corresponding to the channel region of the sensing element. A second distance, greater than the first distance, is formed between the bottom surface and the first top surface along the first direction.

18 Claims, 7 Drawing Sheets

(51) Int. Cl.
  *G02F 1/133* (2006.01)
  *H01L 27/146* (2006.01)
  *G02F 1/1333* (2006.01)
  *G02F 1/1343* (2006.01)
  *G06F 3/041* (2006.01)
  *G06F 3/042* (2006.01)

(52) U.S. Cl.
  CPC .... *H01L 27/14678* (2013.01); *G02F 1/13312* (2021.01); *G02F 2201/58* (2013.01); *G02F 2203/09* (2013.01)

(56) References Cited

U.S. PATENT DOCUMENTS

| | | | |
|---|---|---|---|
| 10,635,881 B2 | 4/2020 | Ling et al. | |
| 2005/0088591 A1* | 4/2005 | Lee | G02F 1/13458 349/113 |
| 2006/0017862 A1 | 1/2006 | Song et al. | |
| 2006/0124828 A1* | 6/2006 | Shin | G01J 1/42 250/205 |
| 2010/0045904 A1 | 2/2010 | Katoh et al. | |
| 2010/0110350 A1* | 5/2010 | Katoh | H01L 31/101 349/110 |
| 2012/0075542 A1* | 3/2012 | Kim | G02F 1/1393 349/33 |

FOREIGN PATENT DOCUMENTS

| | | |
|---|---|---|
| CN | 101681042 A | 3/2010 |
| CN | 103325842 A | 9/2013 |
| CN | 106295611 A | 1/2017 |

\* cited by examiner

DISPLAY DEVICE

This application claims the benefit of People's Republic of China patent application Serial No. 201710794403.1, filed Sep. 6, 2017, the subject matter of which is incorporated herein by reference.

BACKGROUND OF THE INVENTION

Field of the Invention

The invention relates in general to a display device, and more particularly to a display device whose display region is equipped with a function for recognizing biological features.

Description of the Related Art

In recent years, the design of the display panel for mobile phones, automotive devices or wearable devices toward narrow border or full display screen. The future development is to apply the technology of biological feature recognition in the display region. The application of the technology for recognizing biological features in small to medium sized panels is focused on how to increase signal accuracy or detector sensitivity. Most of the current researches aim to increase the intensity of the light sources projected to the biological features or increase the quantity of the light sources projected thereto, the said increase will inevitably increase power consumption. Moreover, as the sensitivity increases, the detector becomes more vulnerable to the interference of noises, and non-collimated light sources may affect or interfere with detector recognition or may even lead the detector to erroneous recognition.

SUMMARY OF THE INVENTION

The disclosure is a display device, and a display region of the display device is equipped with a function for recognizing biological features. According to the embodiments of the present disclosure, a blocking structure of the display device is disposed on the sensing element, the blocking structure has a first opening, and the first opening is disposed correspondingly to the sensing element. The blocking structure may block or reflect most of the non-collimated incident light to reduce the non-collimated incident light from being detected by the sensing element. For example, when a body part with to-be-recognized biological features contacts the display device, the blocking structure can increase an opportunity for most of the non-collimated incident light being blocked or reflected, or reduce an opportunity for most of the non-collimated incident light being detected by the sensing element, or increase the accuracy of the sensing element.

According to one embodiment of the present invention, a display device including a first substrate, a sensing element, a display switch element and a blocking structure is provided. The first substrate has a first top surface, and a first direction is perpendicular to the first top surface. The sensing element is disposed on the first substrate and includes an active layer having a channel region. A first distance is formed between a channel top surface of the channel region and the first top surface along the first direction. The display switch element is disposed on the first substrate and adjacent to the sensing element. The blocking structure is disposed on the sensing element and has a bottom surface and a first opening corresponding to the channel region of the sensing element. A second distance is formed between the bottom surface and the first top surface along the first direction, and the first distance is less than the second distance.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the embodiments of the present disclosure, the blocking structure of the display device is disposed on the sensing element and has a first opening corresponding to the sensing element. The blocking structure may increase an opportunity for most of the non-collimated incident light being blocked or reflected, or may reduce an opportunity for most of the non-collimated incident light being detected by the sensing element. For example, when the body part with to-be-recognized biological features (such as fingerprints, facial lines, palm prints, sole prints, but not limited to this) contacts the display device, a light source is projected to the body part with to-be-recognized biological features. Since the concave or convex veins through which the light source passes have different media paths, the biological features will generate or reflect different light signals, which will be detected by the sensing element or used for recognition. The blocking structure of the present disclosure may reduce the volume of non-collimated noise light detected by the sensing element and therefore increases the accuracy of the sensing element.

A number of embodiments of the present disclosure are disclosed below with reference to accompanying drawings. However, the structure and content disclosed in the embodiments are for exemplary and explanatory purposes only, the scope of protection of the present disclosure is not limited to the embodiments. Designations common to the accompanying drawings and embodiments are used to indicate identical or similar elements. Anyone skilled in the technology field of the invention will be able to make suitable modifications or changes based on the specification disclosed below to meet actual needs without breaching the spirit of the invention. Besides, that a certain layer is disposed "on" another layer or a substrate may refer to the situation when a certain layer is "directly" or "indirectly" disposed on another layer or a substrate. That is, another layer is interposed between the certain layer and the another layer or the substrate. That a certain layer "contacts" another layer or a substrate may refer to the situation when a certain layer "directly contacts" or "indirectly contacts" another layer or a substrate. That is, another layer is interposed between the certain layer and the another layer or the substrate. Moreover, ordinal numbers, such as "the first", "the second", and "the third", are used in the specification and claims to modify the components of the claims. The ordinal numbers of claim components do not imply or represent that the said components have any previous ordinal numbers, nor represent the sequence between a particular claim component and another claim component or the sequence of process in a manufacturing method. The ordinal numbers used to clearly distinguish the claim components having the same designations.

Figure 1:
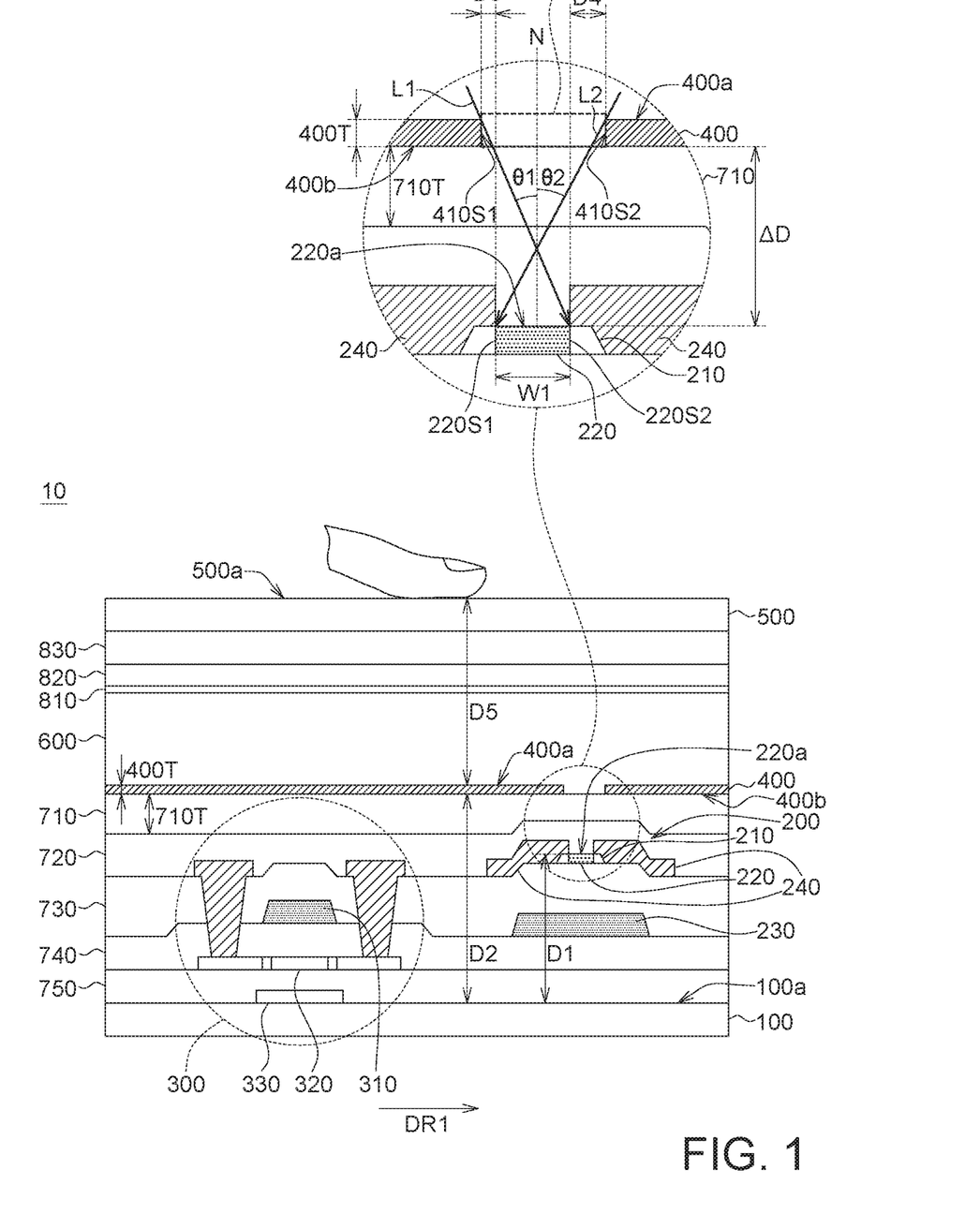
FIG. 1 is a schematic diagram of a display device according to one embodiment of the present disclosure.

FIG. 1 is a schematic diagram of a display device according to one embodiment of the present disclosure. As indicated in FIG. 1, the display device 10 includes a first substrate 100, a sensing element 200, a display switch element 300 and a blocking structure 400. The sensing element 200 is disposed on the first substrate 100, and the sensing element 200 includes an active layer 210 having a channel region 220. A first distance D1 is formed between a channel top surface 220a of the channel region 220 and a first top surface 100a of the first substrate. The first distance D1 may be defined as the shortest distance between the channel top surface 220a and the first top surface 100a along the normal direction of the first top surface 100a. The display switch element 300 is disposed on the first substrate 100 and adjacent to the sensing element 200. The blocking structure 400 is disposed on the sensing element 200, and has a first opening 410 corresponding to the channel region 220 of the sensing element 200. The blocking structure 400 has a bottom surface 400b. A second distance D2 is formed between the bottom surface 400b and the first top surface 100a of the first substrate 100. The second distance D2 may be defined as the shortest distance between the bottom surface 400b and the first top surface 100a along the normal direction of the first top surface 100a. The first distance D1 is less than the second distance D2.

In one embodiment, an absolute value of the difference ΔD between the first distance D1 and the second distance D2 may be greater than 0 μm and less than or equivalent to 10 μm (micrometers) (0 μm<ΔD≤10 μm) or within a range of 0 μm to 10 μm. In other embodiments, the ratio of D1 to D2 may be less than 1 and greater than or equivalent to 1/10 (1<D1/D2≤1/10) or within a range of 1 to 1/10.

As indicated in FIG. 1, the display device 10 further includes a second substrate 500 and a display layer 600. The second substrate 500 is disposed opposite to the first substrate 100. The display layer 600 is disposed between the blocking structure 400 and the second substrate 500. The display layer 600 (e.g., comprising liquid crystals, organic light emitting diodes (OLEDs), quantum dots LEDs (QLEDs or QD-LEDs), fluorescent materials, quantum dots, phosphorescent materials, light emitting diodes, micro light emitting diodes (micro-LEDs), mini light emitting diodes (mini-LEDs) or other display mediums, but the disclosure is not limited) between the two substrates. In some embodiments, the chip size of the light emitting diode is about 300 μm to 10 millimeters (mm), and the chip size of the mini LED is about 100 μm to 300 μm, the chip size of the micro LED is about 1 μm to 100 μm, but the disclosure is not limited thereto.

According to the embodiments of the present disclosure, the first distance D1 is less than the second distance D2, the first opening 410 of the blocking structure 400 is correspondingly disposed on the sensing element 200 and separated from the sensing element 200 by a distance, and the distance may be defined as the difference ΔD (ΔD=D2−D1) between the first distance D1 and the second distance D2, such that the blocking structure 400 may increase an opportunity for most of the non-collimated incident light be blocked or reflected, or to reduce the non-collimated incident light from being detected by the sensing element 200 and therefore increase the accuracy of the sensing element 200.

Moreover, the manufacturing process of the blocking structure 400 or the sensing element 200 may be integrated to the existing process, such as the TFT array process, and the blocking structure 400 is disposed on the sensing element 200 within the display region of the display device 10.

In one embodiment, the blocking structure 400 may comprise a reflective material, such as silver, aluminum, molybdenum, an alloy thereof, a combination thereof, or other suitable materials. In other embodiments, the blocking structure 400 may comprise a light shielding or light absorbing material, but the present disclosure is not limited thereto. In other embodiments, the blocking structure 400 may be comprised a material capable of blocking the light source detected by the sensing element 200 but allowing other light sources to pass through, but the present disclosure is not limited thereto.

In some embodiments, the blocking structure 400 may have continuous or discontinuous structures. In other embodiments, the display device 10 may further include an insulation structure 710, and the insulation structure 710 may have continuous or discontinuous structures. In one example, as indicated in FIG. 1, the first opening 410 of the blocking structure 400 is correspondingly disposed on the channel region 220, and the part of the blocking structure 400 is a continuous film. As indicated in FIG. 1, the insulation structure 710 has continuous structures, the insulation structure 710 may be completely disposed on the underneath film. In some other embodiments, the blocking structure 400 or the insulation structure 710 may have discontinuous structures (not illustrated), the blocking structure 400 or the insulation structure 710 may be formed of multiple patterned blocks in the display device 10, but the present disclosure is not limited thereto.

In one embodiment, as indicated in FIG. 1, the sensing element 200 further includes a gate layer 230 and a drain/source 240, and the drain/source 240 may be disposed on two lateral sides of the active layer 210.

In one embodiment, as indicated in FIG. 1, the direction DR1 may be defined as the direction substantially parallel to the first top surface 100a or substantially perpendicular to the normal direction of the first top surface 100a. Moreover, the direction DR1 may be the direction passing through the drain/source 240 and the channel region 220. The channel region 220 has a width W1 along the direction DR1. The width W1 may be the maximum distance of the channel region 220 between the drain/source 240 along the direction DR1. In some embodiments, the width W1 of the channel region 220 may be within a range of 1 μm to 6 μm (1 μm≤W1≤6 μm). In other words, the width W1 of the channel region 220 is, for example, greater than or equivalent to 1 μm and less than or equivalent to 6 μm (1 μm≤W1≤6 μm).

In some embodiments, the channel region 220 and the blocking structure 400 may be separated from each other by a distance along the direction DR1. For example, the projection of the blocking structure 400 on the first top surface 100a corresponds to a blocking structure projection area, the projection of the channel region 220 on the first top surface 100a corresponds to a channel region projection area, and a distance (the distance D3 or the distance D4 of FIG. 1) may be defined between the blocking structure projection area and the channel region projection area along the direction DR1. Referring to FIG. 1, the distance D3 may be the distance between the first side edge 220S1 of the channel region 220 and the first edge 410S1 of the blocking structure 400 along the direction DR1, wherein the first edge 410S1 is the edge of the blocking structure 400 adjacent to the first opening 410. The distance D4 may be the distance between the second side edge 220S2 of the channel region 220 and the second edge 410S2 of the blocking structure 400 along the direction DR1, wherein the second edge 410S2 is the other edge of the blocking structure 400 adjacent to the first opening 410. In some embodiments, the distance D3 may be equivalent to the distance D4. In other embodiments, the distance D3 may be different from the distance D4. For example, the distance D3 or the distance D4 may be greater than or equivalent to 0 μm and less than or equivalent to 1 μm ($0 \ \mu m \leq D3 \leq 1 \ \mu m$; $0 \ \mu m \leq D4 \leq 1 \ \mu m$). In some other embodiments, the distance D3 or the distance D4 may be greater than or equivalent to 0 μm and less than or equivalent to 0.8 μm ($0 \ \mu m \leq D3 \leq 0.8 \ \mu m$; $0 \ \mu m \leq D4 \leq 0.8 \ \mu m$). In some other embodiments, the distance D3 or the distance D4 may be greater than or equivalent to 0 μm and less than or equivalent to 0.5 μm ($0 \ \mu m \leq D3 \leq 0.5 \ \mu m$: $0 \ \mu m \leq D4 \leq 0.5 \ \mu m$). In some other embodiments, the distance D3 or the distance D4 may be greater than or equivalent to 0 μm and less than or equivalent to 0.2 μm ($0 \ \mu m \leq D3 \leq 0.2 \ \mu m$; $0 \ \mu m \leq D4 \leq 0.2 \ \mu m$). If the distance D3 or the distance D4 is equivalent to 0 μm, this implies that the channel region projection area and the blocking structure projection area may overlap to each other partly.

In some embodiments, as indicated in FIG. 1, the insulation structure 710 may be disposed between the sensing element 200 and the blocking structure 400. In some embodiments, the insulation structure 710 has a thickness 710T. The thickness 710T may be greater than 0 μm and less than or equivalent to 10 μm ($0 \ \mu m < 710T \leq 10 \ \mu m$). The thickness 710T may be within a range of 0 μm to 10 μm. In one embodiment, the insulation structure 710 may comprise a translucent material, such as yttrium oxide or yttrium nitride, a combination thereof, or other suitable materials, but the present disclosure is not limited thereto.

In some embodiments, the blocking structure 400 has a thickness 400T. The thickness 400T may be greater than or equivalent to 250 Å and less than or equivalent to 5000 Å ($250 \ \text{Å} \leq 400T \leq 5000 \ \text{Å}$). The thickness 400T may be within a range of 250 Å-5000 Å ($250 \ \text{Å} \leq 400T \leq 5000 \ \text{Å}$). In some embodiments, the thickness 400T of the blocking structure 400 may be greater than or equivalent to 250 Å and less than or equivalent to 3000 Å ($250 \ \text{Å} \leq 400 \ T \leq 3000 \ \text{Å}$). The thickness 400 T may be within a range of 250 Å to 3000 Å ($250 \ \text{Å} \leq 400 \ T \leq 3000 \ \text{Å}$), but the present disclosure is not limited thereto.

According to some embodiments of the present disclosure, with the insulation structure 710 being disposed between the sensing element 200 and the blocking structure 400 and the patterned blocking structure 400 having the first opening 410 being formed on the insulation structure 710, the non-collimated noise lights may be less likely to be misjudged, or the accuracy of the sensing element 200 may be increased.

In an embodiment, the accuracy of the sensing element 200 may be increased through the collocation design of the difference ΔD between the first distance D1 and the second distance D2, the distance D3, the distance D4, and the width W1.

For example, in an embodiment, as indicated in FIG. 1, the light L1 entering the channel region 220 of the sensing element 200 from the first edge 410S1 of the blocking structure 400 adjacent to the first opening 410 may have a maximum incident angle θ1, and the light L2 entering the channel region 220 of the sensing element 200 from the second edge 410S2 of the blocking structure 400 adjacent to the first opening 410 may have a maximum incident angle θ2. The incident angle θ1 may be defined as the angle between the normal line N of the channel top surface 220a and the incident light L1. The incident angle θ2 may be defined as the angle between the normal line N of the channel top surface 220a and the incident light L2. In one embodiment, through the collocation design of the distance difference ΔD, the distance D3, the distance D4, and the width W1, the range of the maximum incident angle θ1 or the maximum incident angle θ2 within which the incident light may be detected by the sensing element 200 may be changed. The incident light having an incident angle greater than the incident angle θ1 or the incident angle θ2 may be blocked or reflected by the blocking structure 400. For example, the maximum incident angle θ1 and the maximum incident angle θ2 may both be designed as being less than or equivalent to 26.5°. In some embodiments, the maximum incident angle θ1 or the maximum incident angle θ2 may be designed as being less than or equivalent to 21°. In some embodiments, the maximum incident angle θ1 or the maximum incident angle θ2 may be designed as being less than or equivalent to 17°. Thus, through suitable design, the blocking structure 400 may increase an opportunity for most of the non-collimated incident light (incident lights having larger angles (noise light)) be blocked or reflected, or to reduce the non-collimated incident light from being detected by the sensing element 200, or increase the proportion of the collimated lights entering the sensing element 200, such that the detection and recognition of the sensing element 200 may be improved.

In one embodiment, as indicated in FIG. 1, the display device 10 may further include a transparent electrode layer 810 disposed on the sensing element 200. The display device 10 may further include a protection layer 820 and a color filter layer 830. The transparent electrode layer 810, the protection layer 820 and the color filter layer 830 are disposed between the second substrate 500 and the first substrate 100. The transparent electrode layer 810 may be disposed between the color filter layer 830 and the display layer 600. The protection layer 820 is disposed between the color filter layer 830 and the transparent electrode layer 810. Besides, the display device 10 may further include a buffer layer 750, an insulation layer 740, a dielectric layer 730 and a passivation layer 720. The insulation layer 740, the dielectric layer 730 and the passivation layer 720 may be disposed on the first substrate 100. The insulation structure 710 is disposed on the passivation layer 720. In FIG. 1, the TFT structure is exemplified by a top gate TFT structure. However, the TFT structure may also be realized by a bottom gate TFT structure. The active layer of the TFT structure may include low temperature polysilicon (LTPS) transistors, indium zinc oxide (IGZO) transistors, amorphous silicon (a-Si) transistors, or a combination thereof, and the present disclosure is not limited thereto. For example, in FIG. 1, the active layer of the TFT structure is exemplified by LTPS transistors, the stacking structure of the sensing element 200 and the display switch element 300 (LTPS transistors) may be formed by the same manufacturing process (such as the same exposure process or etching process) or separate manufacturing processes. The present disclosure does not limit the variety or processing method of the switch element (or the sensing element).

In one embodiment, as indicated in FIG. 1, the display switch element 300 may further include a gate layer 310, a channel layer 320 and a light shielding layer 330. The gate layer 310 may be disposed on the channel layer 320. As indicated in FIG. 1, the display switch element 300 may be realized by a top gate TFT element, the light shielding layer 330 may reduce the light source from entering the channel layer 320 or reduce causing current leakage.

As indicated in FIG. 1, the display device 10 is exemplified by a reflective display device with biological features.

Figure 1A:
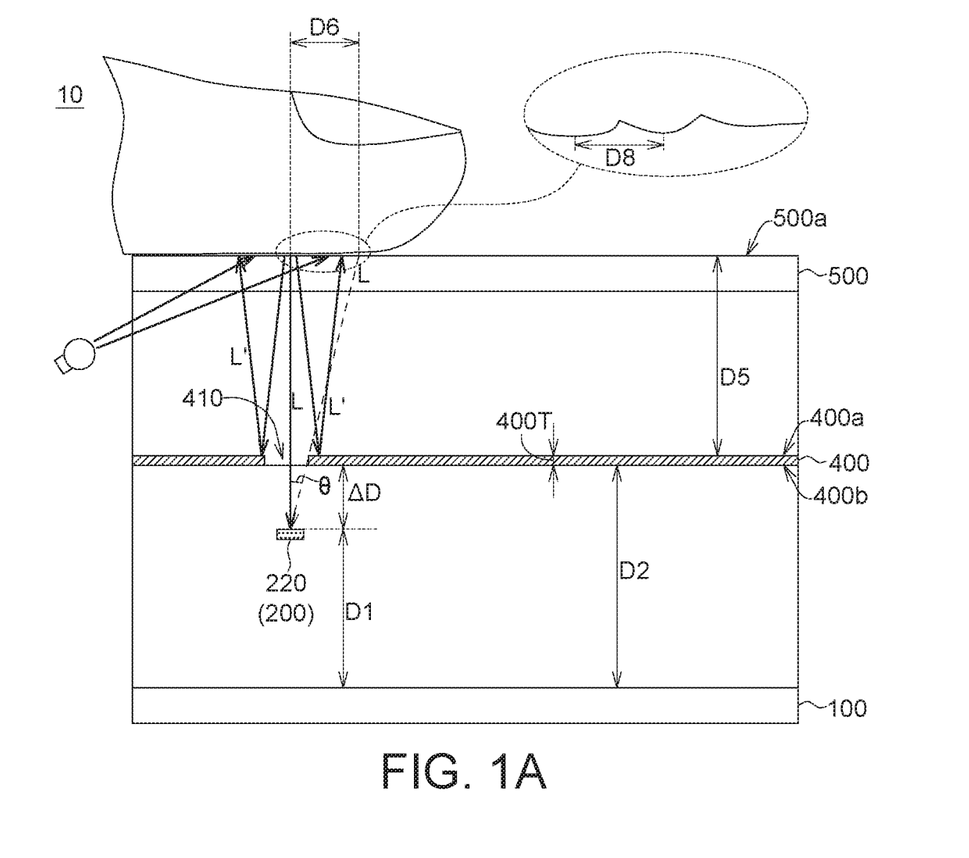
FIG. 1A is an operation diagram of a display device according to one embodiment of the present disclosure.

FIG. 1A is an operation diagram of a display device according to one embodiment of the present disclosure. For elements of the present embodiment similar or same as that of above embodiments, similar or identical designations are used. Relevant descriptions of similar or identical elements which may be obtained with reference to above disclosure are not repeated here. It should be noted that the dimension scales of the elements of FIG. 1A are not based on actual proportion of the product.

In one embodiment, as indicated in FIG. 1A, the first opening 410 of the blocking structure 400 is correspondingly disposed on the channel region 220 of the sensing element 200 and separated from the same by a distance (that is, the difference ΔD between the first distance D1 and the second distance D2), such that the blocking structure 400 may increase an opportunity for most of the non-collimated incident light be blocked or reflected, or to reduce the non-collimated incident light from being detected by the sensing element 200 and therefore increase the accuracy of the sensing element 200. Referring to FIG. 1A, the biological features of FIG. 1A may be exemplified by fingerprints. When a user touches the display device 10 with finger can increase an opportunity for most of the non-collimated incident light L' be blocked or reflected by the blocking structure 400, but the collimated incident light L not blocked or reflected by the blocking structure 400 will be detected by the sensing element 200, and therefore increase the accuracy of the sensing element 200.

In one embodiment, as indicated in FIG. 1A, the finger contact area (such as the second top surface 500a of the second substrate 500) is separated from the blocking structure top surface 400a of the blocking structure 400 by a distance D5, the distance D5 may be defined as the shortest distance between the second top surface 500a and the blocking structure top surface 400a along the normal direction of the first top surface 100a, The distance D5 be equivalent to 500 μm as an example, when the maximum incident angle θ of the incident light L is equivalent to 26.5°, the corresponding light collection distance (the detectable range of the incident light at the finger contact area) is the distance D6, the value of the distance D6 may be obtained according to the formula tan (90°−26.5°)=(D5+400T+ΔD)/D6, is about 250 μm. When the maximum incident angle θ of the incident light L is equivalent to 21°, the value of the distance D6 is about 200 μm, which may be obtained according to the formula tan (90°−21°)=(D5+400T+ΔD)/D6. When the maximum incident angle θ of the incident light L is equivalent to 17°, the value of the distance D6 is about 153 μm, which may be obtained according to the formula tan (90°−17°)=(D5+400T+ΔD)/D6. Suppose the distance D8 between two adjacent convex veins of the finger is within a range of 200 μm to 500 μm. When the distance D6 is less than or equivalent to 250 μm (D6≤250 μm), less than or equivalent to 200 μm (D6≤200 μm), or even less than or equivalent to 153 μm (D6≤153 μm), the blocking structure may increase an opportunity of the noise lights (such as the non-collimated or the fingerprint light signals having larger incident angles) be blocked, or reduce an opportunity of the noise lights entering the channel region 220 of the sensing element, or increase the sensitivity of the sensing element.

Figure 2:
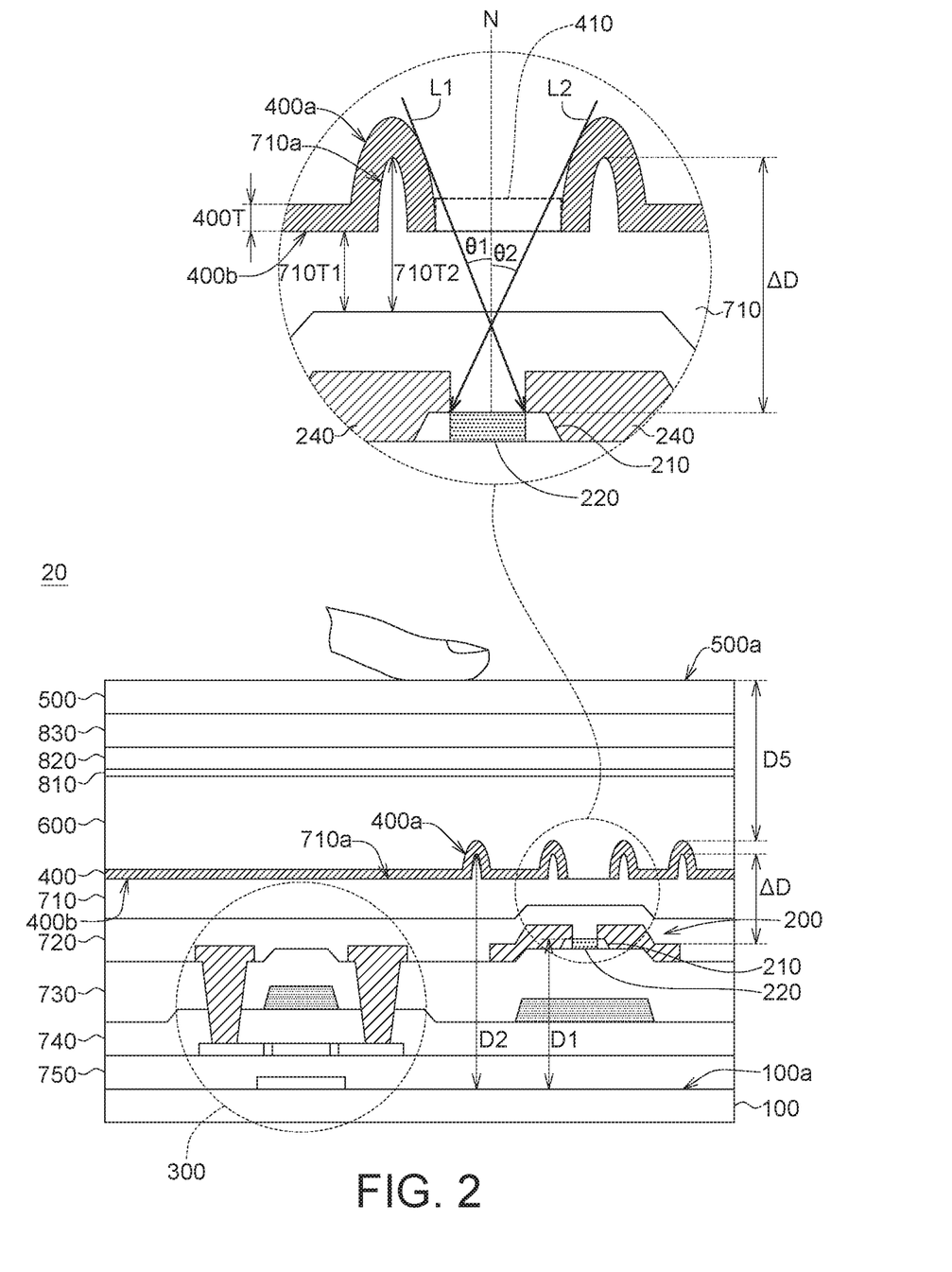
FIG. 2 is a schematic diagram of a display device according to another embodiment of the present disclosure.

FIG. 2 is a schematic diagram of a display device according to another embodiment of the present disclosure. For elements of the present embodiment similar or same as that of above embodiments, similar or identical designations are used. Relevant descriptions of similar or identical elements which may be obtained with reference to above disclosure are not repeated here.

In an embodiment as indicated in FIG. 2, the blocking structure top surface 400a of the blocking structure 400 of the display device 20 may have an irregular shape. For example, the blocking structure 400 may have multiple bumped structures interconnected with flat structures to form the blocking structure top surface 400a having an irregular shape.

In one embodiment, as indicated in FIG. 2, the insulation structure 710 of the display device 20 has an insulation top surface 710a having an irregular shape. For example, the insulation structure 710 may have multiple bumped structures interconnected with flat structures to form the insulation top surface 710a having an irregular shape. Therefore, the insulation structure 710 may have different levels of thickness in different regions. For example, the flat structures of the insulation structure 710 have a thickness 710T1, the bumped structures of the insulation structure 710 have a thickness 710T2 greater than the thickness 710T1.

According to one embodiment of the present disclosure, the blocking structure 400 may be realized by a reflective metal layer. Since the insulation structure 710 may make the insulation top surface 710a have an irregular shape and the reflective metal layer may be directly formed on the insulation top surface 710a of the insulation structure 710 (the blocking structure 400 may contact with the insulation structure 710), the blocking structure 400 may also make the blocking structure top surface 400a have an irregular shape like the insulation top surface 710a.

The display device 20 as indicated in FIG. 2 may be realized by a reflective display device with biological features.

Figure 3:
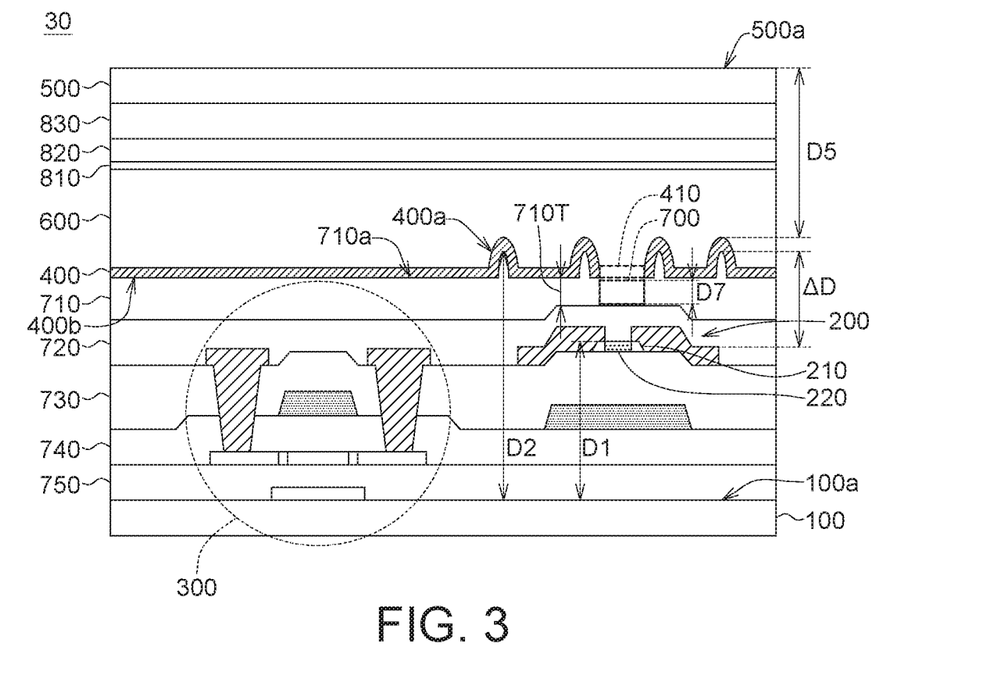
FIG. 3 is a schematic diagram of a display device according to an alternate embodiment of the present disclosure.

FIG. 3 is a schematic diagram of a display device according to an alternate embodiment of the present disclosure. For elements of the present embodiment similar or same as that of above embodiments, similar or identical designations are used. Relevant descriptions of similar or identical elements which may be obtained with reference to above disclosure are not repeated here.

In one embodiment, as indicated in FIG. 3, the insulation structure 710 of the display device 30 may further have a second opening 700 disposed correspondingly to the first opening 410 of the blocking structure 400. Moreover, the second opening 700 corresponds to the channel region 220 of the sensing element 200. In one embodiment, the size (or shape) of the second opening 700 may be same as or different from the size (or shape) of the first opening 410. For example, the projection of the first opening 410 on the first top surface 100a corresponds to a first opening projection area, and the projection of the second opening 700 on the first top surface 100a corresponds to a second opening projection area. The first opening projection area and the second opening projection area may be same as or different from each other, the first opening projection area and the second opening projection area may completely or partly overlap to each other, and the present disclosure is not limited thereto.

In another embodiment, as indicated in FIG. 3, the height D7 of the second opening 700 may be less than or equivalent to the thickness 710T1 of the insulation structure 710. In some embodiments, the height D7 is less than the thickness 710T1, such that the second opening 700 does not expose the passivation layer 720. The bottom of the second opening 700 does not expose the material disposed under the insulation structure 710. In some other embodiments, the height D7 of the second opening 700 may be equivalent to the thickness 710T1 of the insulation structure 710, such that the second opening 700 exposes the passivation layer 720.

The display device 30 as indicated in FIG. 3 may be realized by a reflective display device with biological features.

Figure 4:
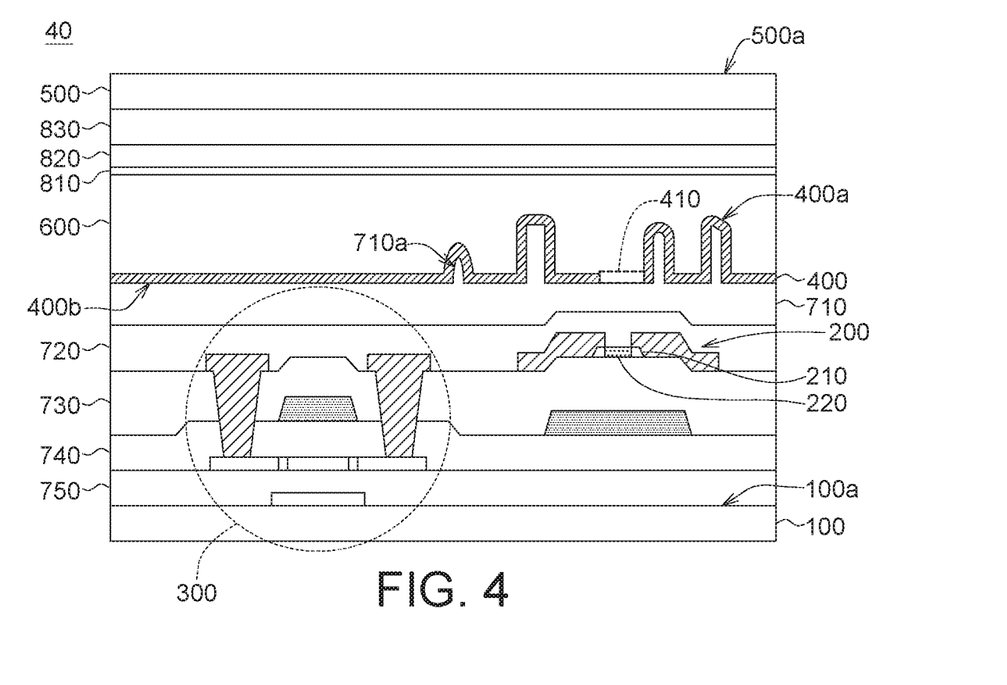
FIG. 4 is a schematic diagram of a display device according to another alternate of the present disclosure embodiment.

FIG. 4 is another alternate embodiment a schematic diagram of a display device according to of the present disclosure. For elements of the present embodiment similar or same as that of above embodiments, similar or identical designations are used. Relevant descriptions of similar or identical elements which may be obtained with reference to above disclosure are not repeated here.

In one embodiment, as indicated in FIG. 4, the insulation structure 710 of the display device 40 may have multiple bumped structures having different shapes such as rectangle, triangle, cylinder, arc, or a combination thereof, and the present disclosure is not limited thereto. With the insulation structure 710 having bumped structures and flat structures, the insulation top surface 710a of the insulation structure 710 has an irregular shape. When the blocking structure 400 is disposed on the insulation top surface 710a having an irregular shape, the blocking structure top surface 400a may vary with the shape of the insulation top surface 710a.

In one embodiment, as indicated in FIG. 4, the blocking structure top surface 400a of the blocking structure 400 has an irregular shape. For example, the blocking structure top surface 400a may have multiple bumps having different shapes.

The aforementioned insulation top surface 710a or blocking structure top surface 400a having different shapes may be suitably combined with the aforementioned continuous discontinuous blocking structure 400 (or insulation structure 710) or discontinuous blocking structure 400 (or insulation structure 710), and the present disclosure is not limited thereto.

The display device 40 as indicated in FIG. 4 may be realized by a reflective display device with biological features.

Figure 5:
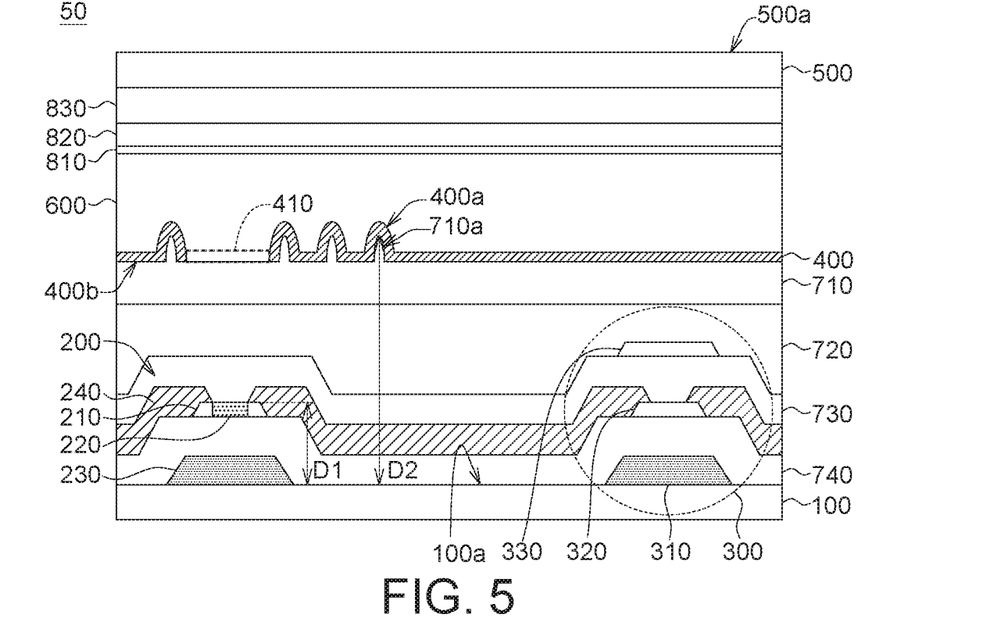
FIG. 5 is a schematic diagram of a display device according to further another embodiment of the present disclosure.

FIG. 5 is further another embodiment a schematic diagram of a display device according to of the present disclosure. For elements of the present embodiment similar or same as that of above embodiments, similar or identical designations are used. Relevant descriptions of similar or identical elements which may be obtained with reference to above disclosure are not repeated here.

In one embodiment, as indicated in FIG. 5, the difference between the display device 50 and the display device 20 of the above embodiments mainly is the structure of the display switch element 300. As indicated in FIG. 5, the display switch element 300 of the display device 50 includes a gate layer 310, a channel layer 320 and a light shielding layer 330. The gate layer 310 is disposed under the channel layer 320. The light shielding layer 330 is disposed on the channel layer 320. As indicated in FIG. 5, the display switch element 300 is exemplified by a bottom gate type TFT element, and the light shielding layer 330 may block and reduce the light, which passes through the first top surface 100a and is reflected by the blocking structure 400, from entering the channel layer 320 and causing current leakage to the channel layer 320.

Figure 6:
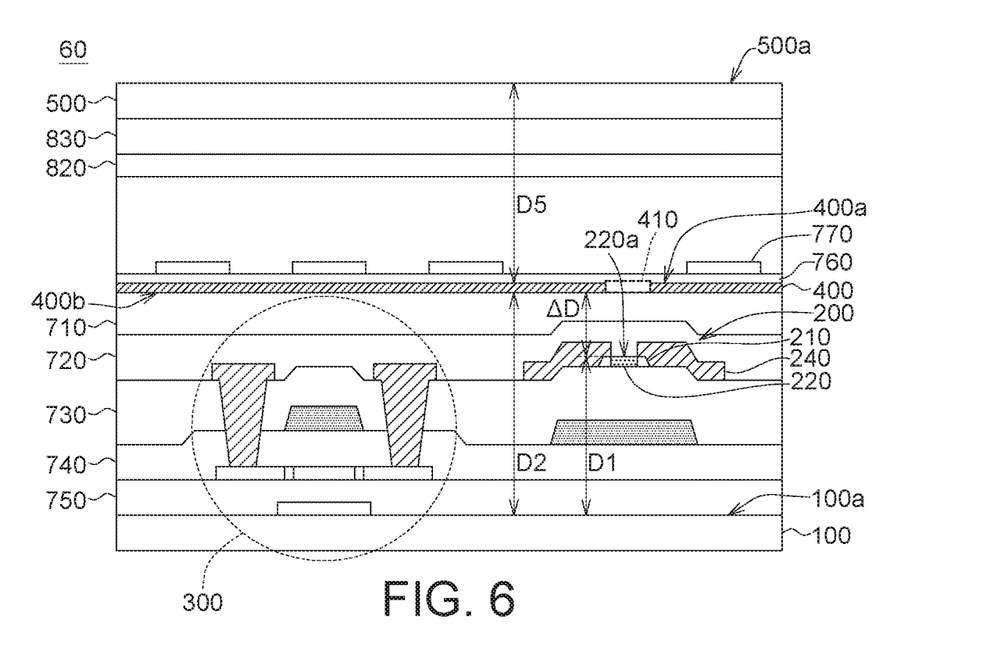
FIGS. 6-8 are schematic diagrams of a display device according to some other embodiments of the present disclosure.
Figure 7:
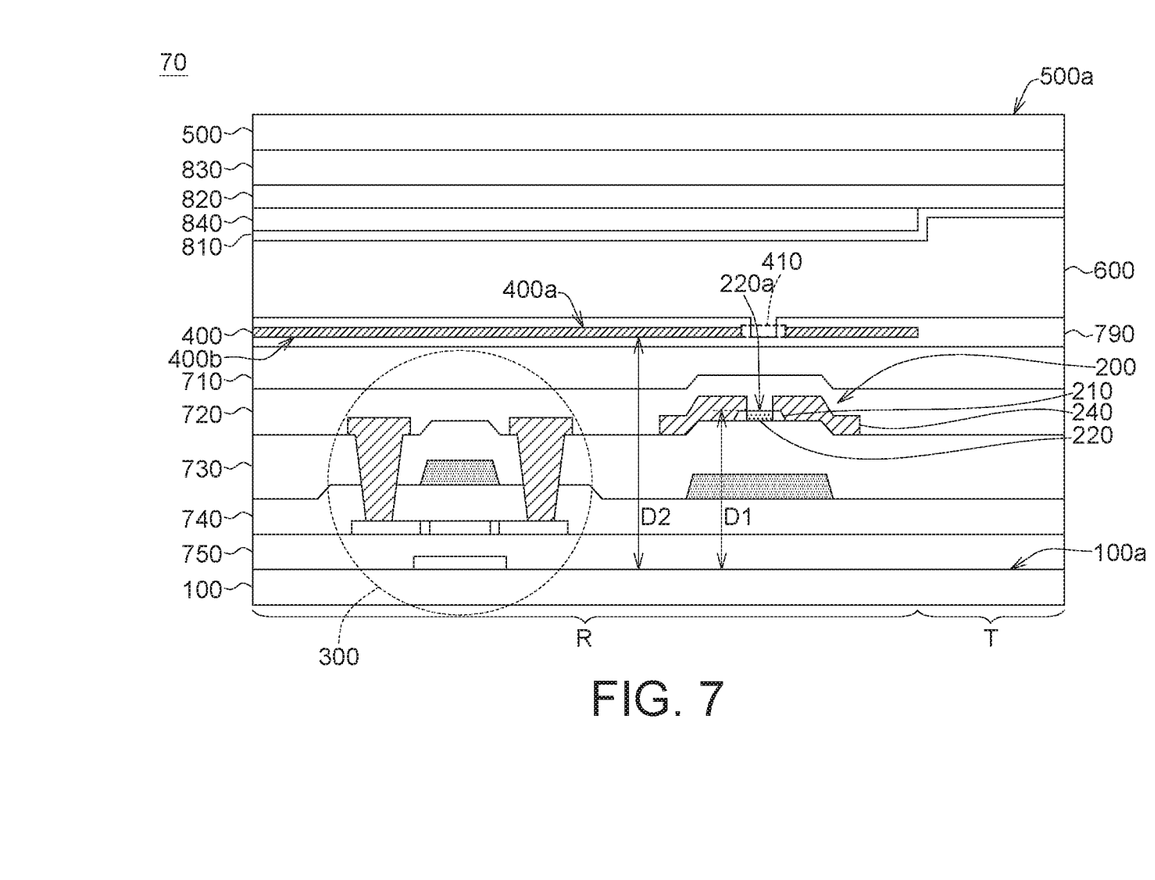
Figure 8:
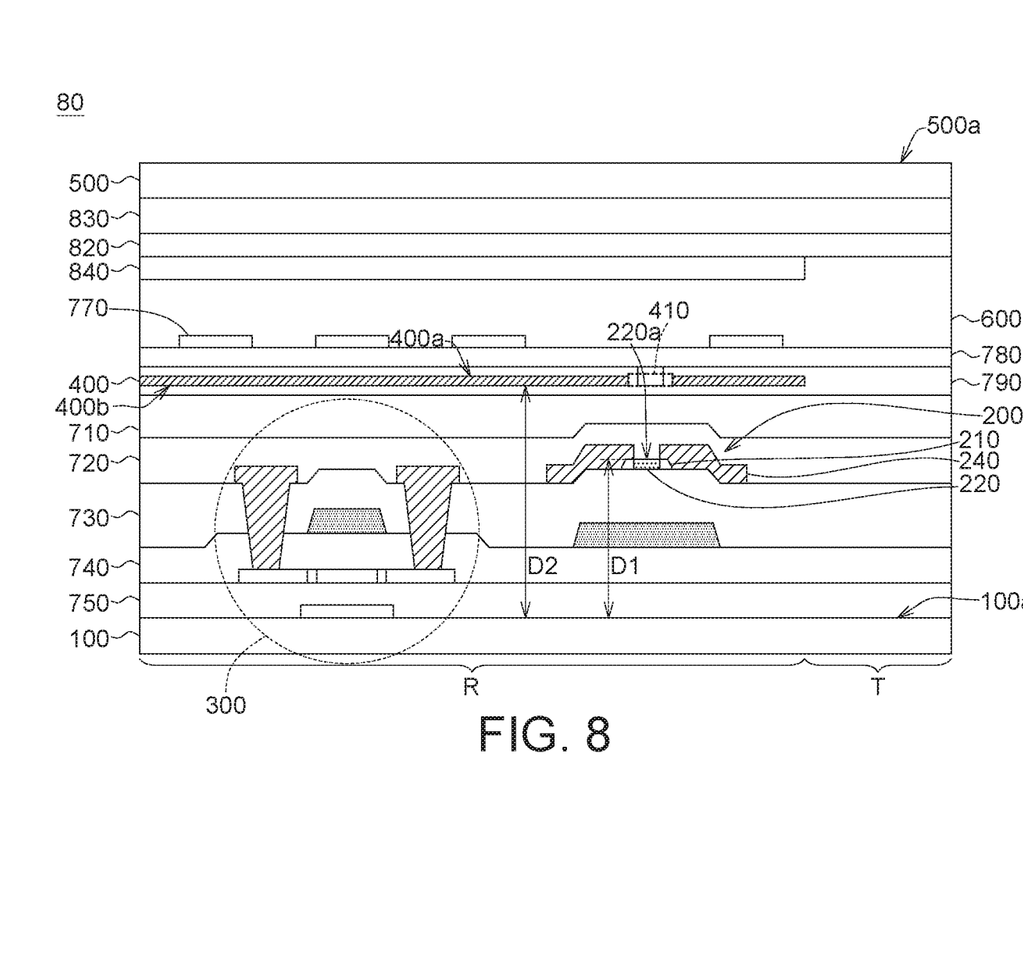

FIGS. 6 to 8 are schematic diagrams of a display device according to some other embodiments of the present disclosure. For elements of the present embodiment similar or same as that of above embodiments, similar or identical designations are used. Relevant descriptions of similar or identical elements which may be obtained with reference to above disclosure are not repeated here.

In some embodiments, as indicated in FIG. 6, the display device 60 may further include a patterned transparent electrode layer 770 disposed on the sensing element 200. The protection layer 820 and the color filter layer 830 may be disposed between the second substrate 500 and the first substrate 100.

In one embodiment, as indicated in FIG. 6, the display device 60 may further include a passivation layer 760 disposed between the blocking structure 400 and the transparent electrode layer 770. The passivation layer 760, which is disposed on the blocking structure 400 or covers the blocking structure 400. The patterned transparent electrode layer 770 is disposed on the passivation layer 760. The display device 60 as indicated in FIG. 6 may be realized by a reflective fringe field switching (FFS) liquid crystal display (LCD) device.

In some embodiments, as indicated in FIG. 7, the display device 70 may have a transmission region T and a reflection region R. The sensing element 200, the display switch element 300 and the blocking structure 400 may be disposed in the reflection region R. In other embodiments, the display switch element 300 may also be disposed in the transmission region T, and the present disclosure is not limited thereto. As indicated in FIG. 7, the display device 70 may further include a transparent electrode layer 790, which is disposed on the insulation structure 710 or covers the transmission region T and the reflection region R. The blocking structure 400 may be interposed within the transparent electrode layer 790. The display device 70 may further include another protection layer 840 disposed between the protection layer 820 and the display layer 600. The protection layer 840 may be disposed in the reflection region R only, and the transparent electrode layer 810 is disposed on the display layer 600 and interposed between the protection layer 840 and the display layer 600. The protection layer 840 is disposed on the protection layer 820 or may be disposed in the reflection region R only, such that the thickness of the display layer 600 in the reflection region R may be reduced. The transmission region T and the reflection region R may be designed to have the display layer 600 with different levels of thickness in the two regions. For example, if the light enters the reflection region R from the second substrate 500, the light, which passes through the display layer 600 for the first time, may be reflected by the blocking structure 400 to pass through the display layer 600 again (the second time), and then emitted towards the second substrate 500. Therefore, the optical path of the light in the reflection region R includes the sum of the optical path of the light which passes through the display layer 600 twice (not illustrated). The light from the backlight source (not illustrated) entering the transmission region T passes through the display layer 600 once and then emitted towards the second substrate 500. Thus, the protection layer 840 may be disposed in the reflection region R only, such that the optical path difference between the optical path in the reflection region R, or the optical path in the transmission region T may be reduced, and the problem of the transmission region T and the reflection region R having non-uniform brightness due to the optical path difference may thus be decreased.

The display device 70 as indicated in FIG. 7 may be realized by a transflective type vertical alignment (VA) LCD device. In the embodiment as indicated in FIG. 7, the difference ΔD is defined as the difference between the first distance D1 and the second distance D2 (the gap between the bottom surface 400b and the channel top surface 220a).

In some embodiments, as indicated in FIG. 8, the display device 80 may have the transmission region T and the reflection region R, and all of the sensing element 200, the display switch element 300 and the blocking structure 400 may be disposed in the reflection region R.

As indicated in FIG. 8, the display device 80 may further include a passivation layer 780 and a transparent electrode layer 790, the transparent electrode layer 790 is disposed on the insulation structure 710, or the transparent electrode layer 790 covers the transmission region T and the reflection region R. The blocking structure 400 is interposed within the transparent electrode layer 790. The passivation layer 780 is disposed on the transparent electrode layer 790. In the embodiment of FIG. 8, the difference ΔD is defined as the difference between the first distance D1 and the second distance D2 (the gap between the bottom surface 400b and the channel top surface 220a), The display device 80 includes another protection layer 840, which is disposed between the protection layer 820 and the display layer 600, and the protection layer 840 may be disposed in the reflection region R only. The protection layer 840 may be used to reduce the optical path difference between the optical path in the reflection region R and the optical path in the transmission region T. The display device 80 as indicated in FIG. 8 may be realized by a transflective type fringe field switching (FFS) LCD device.

The above examples of reflective or transflective type display devices as indicated in FIGS. 1 to 8 may be combined with a required LC mode (such as the FFS type, the TN type, the VA type, and the IPS type), and the display layer thereof does not necessarily include a liquid crystal material or an organic light-emitting material. Moreover, the stacking structure of the present disclosure is for explanatory and exemplary purposes only, not for limiting the present disclosure.

While the disclosure has been described by way of example and in terms of the preferred embodiment(s), it is to be understood that the disclosure is not limited thereto. On the contrary, it is intended to cover various modifications or similar arrangements (or procedures), and the scope of the appended claims therefore should be accorded the broadest interpretation so as to encompass all such modifications and similar arrangements and procedures.

What is claimed is:

1. A display device comprising:
   a first substrate having a first top surface;
   a sensing element disposed on the first substrate, wherein the sensing element comprises an active layer having a channel region, and a first distance is formed between a channel top surface of the channel region and the first top surface along a first direction perpendicular to the first top surface;
   a display switch element disposed on the first substrate and adjacent to the sensing element;
   a blocking structure disposed on the sensing element, wherein the blocking structure has a bottom surface and a first opening, the first opening corresponds to the channel region of the sensing element, a second distance is formed between the bottom surface and the first top surface along the first direction, and the first distance is less than the second distance; and
   an insulation structure disposed between the sensing element and the blocking structure, wherein an insulation top surface of the insulation structure has an irregular shape, and the insulation structure has a second opening corresponding to the first opening and the channel region.

2. The display device according to claim 1, wherein a width of the channel region of the sensing element is greater than or equivalent to 1 μm and less than or equivalent to 6 μm.

3. The display device according to claim 1, wherein in a view along the first direction, a third distance is formed between the channel region and the blocking structure, and the third distance is greater than 0 μm and less than or equivalent to 1 μm.

4. The display device according to claim 1, wherein an absolute value of the difference between the first distance and the second distance is greater than 0 μm and less than or equivalent to 10 μm.

5. The display device according to claim 1, wherein a top surface of the blocking structure has an irregular shape.

6. The display device according to claim 1, wherein the blocking structure has a thickness greater than or equivalent to 250 Å and less than or equivalent to 5000 Å.

7. The display device according to claim 1, wherein the blocking structure comprises a reflective material, light shielding material or light absorbing material.

8. The display device according to claim 1, wherein the insulation structure has a thickness greater than 0 μm and less than or equivalent to 10 μm.

9. The display device according to claim 1, wherein the blocking structure contacts with the insulation structure.

10. The display device according to claim 1, further comprising a passivation layer structure disposed on the first substrate, wherein the insulation structure is disposed on the passivation layer structure.

11. The display device according to claim 10, wherein the second opening exposes the passivation layer structure.

12. The display device according to claim 1, further comprising:
    a transparent electrode layer disposed on the sensing element; and
    a passivation layer disposed between the blocking structure and the transparent electrode layer.

13. The display device according to claim 1, wherein the sensing element, the display switch element and the blocking structure are disposed in a reflection region.

14. The display device according to claim 1, further comprising:
    a second substrate disposed opposite to the first substrate; and
    a display layer disposed between the blocking structure and the second substrate.

15. The display device according to claim 14, further having a reflection region and a transmission region.

16. The display device according to claim 15, wherein a thickness of the display layer within the transmission region is different from a thickness of the display layer within the reflection region.

17. The display device according to claim 15, wherein the display switch element is disposed in the transmission region.

18. The display device according to claim 1, further comprising a transparent electrode layer, wherein the blocking structure is interposed within the transparent electrode layer.

* * * * *